US011205612B2

(12) United States Patent
Pan et al.

(10) Patent No.: US 11,205,612 B2
(45) Date of Patent: Dec. 21, 2021

(54) INTEGRATED CIRCUIT PACKAGE AND METHOD

(71) Applicant: Taiwan Semiconductor Manufacturing Company, Ltd., Hsinchu (TW)

(72) Inventors: Chih-Chien Pan, Taipei (TW); Li-Hui Cheng, New Taipei (TW); Chin-Fu Kao, Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 80 days.

(21) Appl. No.: 16/707,908

(22) Filed: Dec. 9, 2019

(65) Prior Publication Data

US 2020/0111729 A1 Apr. 9, 2020

Related U.S. Application Data

(63) Continuation of application No. 16/138,099, filed on Sep. 21, 2018, now Pat. No. 10,504,824.

(51) Int. Cl.

| | |
|---|---|
| ***H01L 23/498*** | (2006.01) |
| ***H01L 25/065*** | (2006.01) |
| ***H01L 21/304*** | (2006.01) |
| ***H01L 21/306*** | (2006.01) |
| ***H01L 21/56*** | (2006.01) |
| ***H01L 23/00*** | (2006.01) |

(Continued)

(52) U.S. Cl.

CPC ...... *H01L 23/49811* (2013.01); *H01L 21/304* (2013.01); *H01L 21/30604* (2013.01); *H01L 21/561* (2013.01); *H01L 21/78* (2013.01); *H01L 23/3114* (2013.01); *H01L 23/49827* (2013.01); *H01L 24/09* (2013.01); *H01L 24/81* (2013.01); *H01L 24/97* (2013.01); *H01L 25/0652* (2013.01)

(58) Field of Classification Search

CPC .................................................. H01L 25/0652

See application file for complete search history.

(56) References Cited

U.S. PATENT DOCUMENTS

| | | | |
|---|---|---|---|
| 6,939,746 | B2 | 9/2005 | Bolken |
| 8,558,360 | B2 | 10/2013 | Kim et al. |

(Continued)

FOREIGN PATENT DOCUMENTS

| | | | |
|---|---|---|---|
| CN | 102054795 | A | 5/2011 |
| JP | 2009158623 | A | 7/2009 |

(Continued)

*Primary Examiner* — William A Harriston

(74) *Attorney, Agent, or Firm* — Slater Matsil, LLP

(57) ABSTRACT

In an embodiment, a package includes: an interposer having a first side; a first integrated circuit device attached to the first side of the interposer; a second integrated circuit device attached to the first side of the interposer; an underfill disposed beneath the first integrated circuit device and the second integrated circuit device; and an encapsulant disposed around the first integrated circuit device and the second integrated circuit device, a first portion of the encapsulant extending through the underfill, the first portion of the encapsulant physically disposed between the first integrated circuit device and the second integrated circuit device, the first portion of the encapsulant being planar with edges of the underfill and edges of the first and second integrated circuit devices.

20 Claims, 21 Drawing Sheets

(51) Int. Cl.

| | |
|---|---|
| ***H01L 23/31*** | (2006.01) |
| ***H01L 21/78*** | (2006.01) |

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,721,923 | B1 | 8/2017 | Shih |
| 9,735,131 | B2 | 8/2017 | Su et al. |
| 2002/0121705 | A1 | 9/2002 | Pu et al. |
| 2004/0262776 | A1* | 12/2004 | Lebonheur .......... H01L 23/3135 257/778 |
| 2013/0330880 | A1 | 12/2013 | Dang et al. |
| 2015/0200179 | A1 | 7/2015 | Do et al. |
| 2017/0194289 | A1* | 7/2017 | Chen ..................... H01L 21/563 |

FOREIGN PATENT DOCUMENTS

| | | | |
|---|---|---|---|
| JP | 2017092385 | A | 5/2017 |
| TW | 201820566 | A | 6/2018 |

* cited by examiner

INTEGRATED CIRCUIT PACKAGE AND METHOD

PRIORITY CLAIM AND CROSS-REFERENCE

This application is a continuation of U.S. patent application Ser. No. 16/138,099, filed on Sep. 21, 2018, entitled "Integrated Circuit Package and Method," which application is hereby incorporated herein by reference in its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
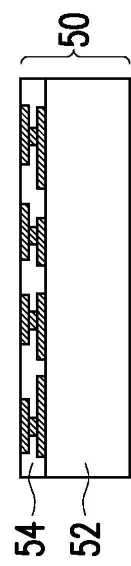
FIG. 1 is a cross-sectional view of an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, integrated circuit devices are attached to a wafer, and an underfill material is formed under the integrated circuit devices. Breaks are formed between the integrated circuit devices, which may decrease the warpage of the wafer in subsequent processing. The breaks are formed by forming dams on the wafer between the integrated circuit devices before forming the underfill material. The underfill material is then dispensed, and the dams are removed. Forming the underfill breaks by use of the dams may allow the breaks to be formed in asymmetric packages or packages with an arbitrary device layout.

FIG. 1 is a cross-sectional view of an integrated circuit device 50, in accordance with some embodiments. The integrated circuit device 50 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit device 50 may be formed in a wafer, which may include different device regions that are singulated in subsequent steps to form a plurality of integrated circuit devices 50. The integrated circuit device 50 includes a substrate 52 and an interconnect structure 54.

The substrate 52 may include a bulk semiconductor substrate, semiconductor-on-insulator (SOI) substrate, multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices, such as transistors, capacitors, resistors, diodes, and the like, may be formed in and/or on an active surface (e.g., the surface facing upward) of the substrate 52.

An interconnect structure 54 having one or more dielectric layer(s) and respective metallization pattern(s) is formed on the active surface of the substrate 52. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spin coating, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors such as conductive pillars or contact pads, are formed in and/or on the interconnect structure 54 to provide an external electrical connection to the circuitry and devices. One of ordinary skill in the art will appreciate that the above examples are provided for illustrative purposes. Other circuitry may be used as appropriate for a given application.

In some embodiments, the integrated circuit device 50 is a stacked device that includes multiple substrates 52. For example, the integrated circuit device 50 may be a memory device such as a hybrid memory cube (HMC) module, a high bandwidth memory (HBM) module, or the like that includes multiple memory dies. In such embodiments, the integrated circuit device 50 includes multiple substrates 52 interconnected by vias. Each of the substrates 52 may (or may not) have a separate interconnect structure 54.

Figure 2:
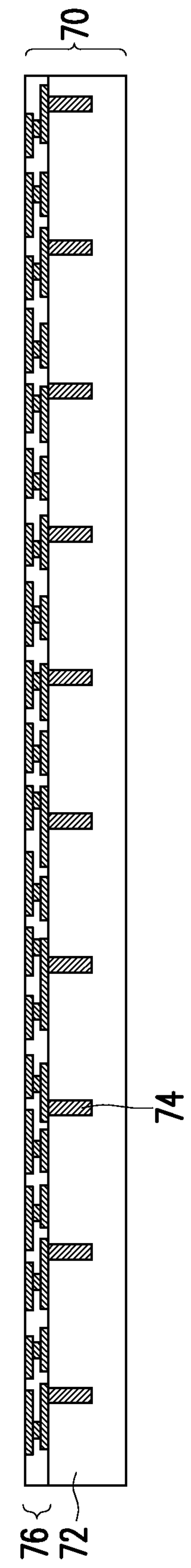
FIG. 2 is a cross-sectional view of an interposer, in accordance with some embodiments.

FIG. 2 is a cross-sectional view of an interposer 70, in accordance with some embodiments. Although only one interposer 70 is shown, it should be appreciated that the interposer 70 may be formed in a wafer having multiple device regions, with each device region used to form one interposer 70. The interposer 70 includes a substrate 72, through vias 74, and an interconnect structure 76.

The substrate 72 may be a bulk semiconductor substrate, SOI substrate, multi-layered semiconductor substrate, or the like. The semiconductor material of the substrate 72 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 72 may be doped or undoped. Active devices such as transistors may (or may not) be in and/or on a front surface (e.g., the surface facing upward) of the substrate 72. Passive devices such as capacitors, resistors, diodes, or the like may (or may not) be in and/or on the front surface of the substrate 72.

The through vias 74 are formed to extend from the front surface of the substrate 72 into substrate 72. The through vias 74 are also sometimes referred to as through-substrate vias or through-silicon vias (TSVs) when the substrate 72 is a silicon substrate. The through vias 74 may be formed by forming recesses in the substrate 72 by, for example, etching, milling, laser techniques, a combination thereof, and/or the like. A thin dielectric material may be formed in the recesses, such as by using an oxidation technique. A thin barrier layer may be conformally deposited over the front side of the substrate 72 and in the openings, such as by CVD, atomic layer deposition (ALD), physical vapor deposition (PVD), thermal oxidation, combinations thereof, and/or the like. The barrier layer may be formed from a nitride or an oxynitride, such as titanium nitride, titanium oxynitride, tantalum nitride, tantalum oxynitride, tungsten nitride, combinations thereof, and/or the like. A conductive material may be deposited over the thin barrier layer and in the openings. The conductive material may be formed by an electro-chemical plating process, CVD, ALD, PVD, combinations thereof, and/or the like. Examples of conductive materials are copper, tungsten, aluminum, silver, gold, combinations thereof, and/or the like. Excess conductive material and barrier layer is removed from the front side of the substrate 72 by, for example, a chemical-mechanical polish (CMP). Thus, the through vias 74 may include a conductive material, with a thin barrier layer between the conductive material and the substrate 72.

The interconnect structure 76 is formed over the front surface of the substrate 72, and is used to electrically connect the devices of the substrate 52 (if any) and/or the through vias 74 together and/or to external devices. The interconnect structure 76 may include one or more dielectric layer(s) and respective metallization pattern(s) in the dielectric layer(s). The metallization patterns may include vias and/or traces to interconnect any devices and/or through vias 74 together and/or to an external device. The dielectric layers may be formed from silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method, such as spin coating, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may be formed from one or more layers of TaN, Ta, TiN, Ti, CoW, or the like, deposited by ALD or the like, and the conductive material may be formed from copper, aluminum, tungsten, silver, combinations thereof, or the like, and may be deposited by CVD, PVD, or the like. Any excessive diffusion barrier layer and/or conductive material on the dielectric layer may be removed, such as by using a CMP.

FIGS. 3A through 15 are cross-section views of intermediate steps during a process for forming stacked semiconductor devices, in accordance with some embodiments. In FIGS. 3A through 14, a first device package 100 is formed by bonding various integrated circuit devices 50 to the front side of the interposer 70. In some embodiments, the first device package 100 is a chip-on-wafer (CoW) package, although it should be appreciated that embodiments may be applied to other three-dimensional integrated circuit (3DIC) packages. In FIG. 15, a second device package 200 is formed by mounting the first device package 100 to a package substrate. In an embodiment, the second device package 200 is a chip-on-wafer-on-substrate (CoWoS) package, although it should be appreciated that embodiments may be applied to other 3DIC packages.

Figure 3A:
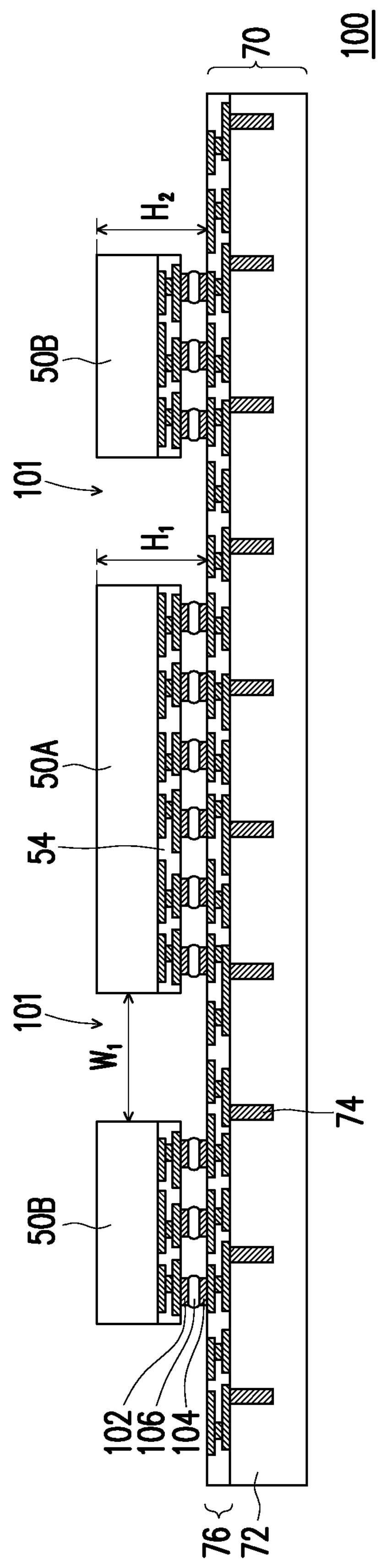
FIGS. 3A through 15 are cross-section views of intermediate steps during a process for forming stacked semiconductor devices, in accordance with some embodiments.

In FIG. 3A, a plurality of the integrated circuit devices 50 are attached to the interposer 70. The integrated circuit devices 50 include multiple devices 50A and 50B with different functions. The interconnect structures 54 and 76 are connected to physically and electrically connect the integrated circuit devices 50A and 50B and the interposer 70. The integrated circuit devices 50A and 50B may each have a single function (e.g., a logic device, memory die, etc.), or may have multiple functions (e.g., a SoC). In an embodiment, the integrated circuit devices 50A are logic devices such as CPUs and the integrated circuit devices 50B are memory devices such as HBM modules. The integrated circuit devices 50A and 50B may be attached to the interconnect structure 76 using, for example, a pick-and-place tool.

Back surfaces of the integrated circuit devices 50A are disposed a height $H_1$ from the interconnect structure 76, and back surfaces of the integrated circuit devices 50B are disposed a height $H_2$ from the interconnect structure 76. The heights $H_1$ and $H_2$ may be the same, or may be different. In some embodiments, the height $H_1$ is in the range of from about 50 μm to about 800 μm, and the height $H_2$ is in the range of from about 50 μm to about 800 μm. The integrated circuit devices 50A and 50B are laterally separated by gaps 101. The gaps 101 have a width $W_1$. In some embodiments, the width $W_1$ is in the range of from about 40 μm to about 150 μm. The gaps 101 between the integrated circuit devices 50A and 50B may be the same distance or different distances.

Figure 3B:
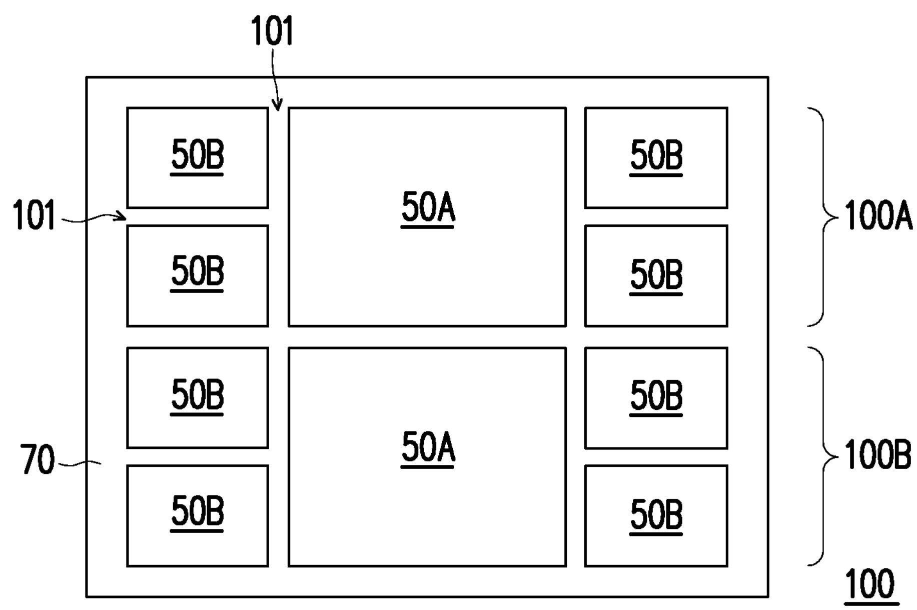
Figure 3C:
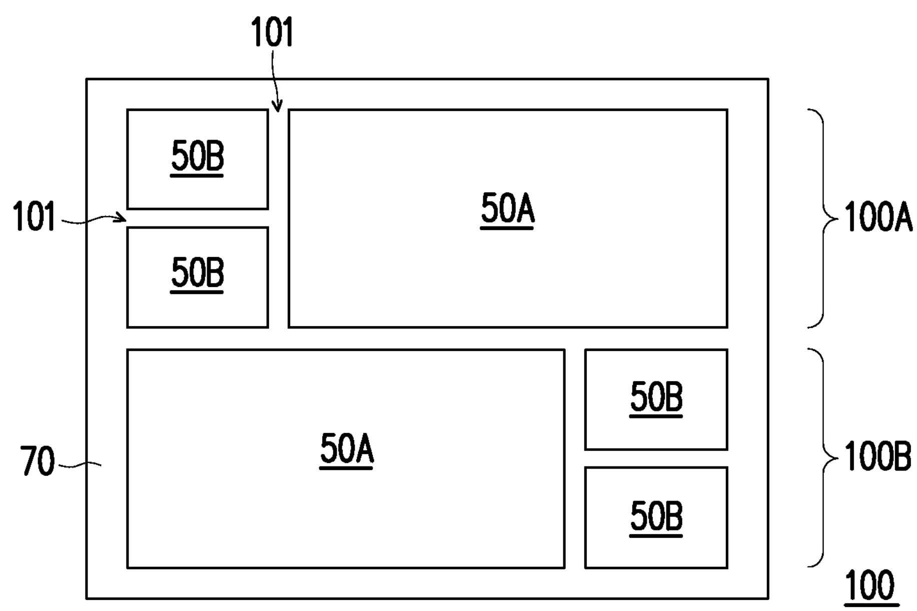

In embodiments where the interposer 70 is formed in a wafer, the integrated circuit devices 50A and 50B may be attached in different device regions of the wafer, which will be singulated in subsequent steps to form multiple first device packages 100. FIGS. 3B and 3C are various top views of the structure of FIG. 3A, showing regions 100A and 100B. The regions 100A and 100B each containing multiple devices 50A and 50B. In some embodiments, such as the embodiment of FIG. 3B, the integrated circuit devices 50B are symmetrically laid out adjacent the integrated circuit devices 50A. In some embodiments, such as the embodiment of FIG. 3C, the integrated circuit devices 50B are asymmetrically laid out adjacent the integrated circuit devices 50A. An asymmetric layout may allow the integrated circuit devices 50B to be located closer to input/output (I/O) connecting regions of the integrated circuit devices 50A.

In the embodiment shown, the integrated circuit devices 50A and 50B are attached to the interconnect structure 76 with connections that include conductive bumps 102 and 104, and conductive connectors 106. The conductive bumps 102 and 104 are formed from a conductive material such as copper, aluminum, gold, nickel, palladium, the like, or combinations thereof and may be formed by sputtering, printing, electro plating, electroless plating, CVD, or the like. The conductive bumps 102 and 104 may be solder-free and have substantially vertical sidewalls, and may be referred to as μbumps. The conductive bumps 102 are electrically and physically connected to the interconnect structure 54, and the conductive bumps 104 are electrically and physically connected to the interconnect structure 76. The conductive connectors 106 bond the conductive bumps 102 and 104. The conductive connectors 106 may be formed from a conductive material such as solder, and may be formed by initially forming a layer of solder on the conductive bumps 102 or 104 through methods such as evaporation, electroplating, printing, solder transfer, ball placement, or the like. Once the layer of solder has been formed, a reflow process may be performed in order to shape the conductive connectors 106 into desired bump shapes.

In other embodiments, the integrated circuit devices 50A and 50B are attached to the interconnect structure 76 by face-to-face bonds. For example, hybrid bonding, fusion bonding, direct bonding, dielectric bonding, metal bonding, or the like may be used to attach the interconnect structures 54 and 76 without the use of solder. Further, a mix of bonding techniques could be used, e.g., some of the integrated circuit devices 50A and 50B could be bonded to the interconnect structure 76 by conductive connectors 106, and other integrated circuit devices 50A and 50B could be bonded to the interconnect structure 76 by face-to-face bonds.

Figure 4:
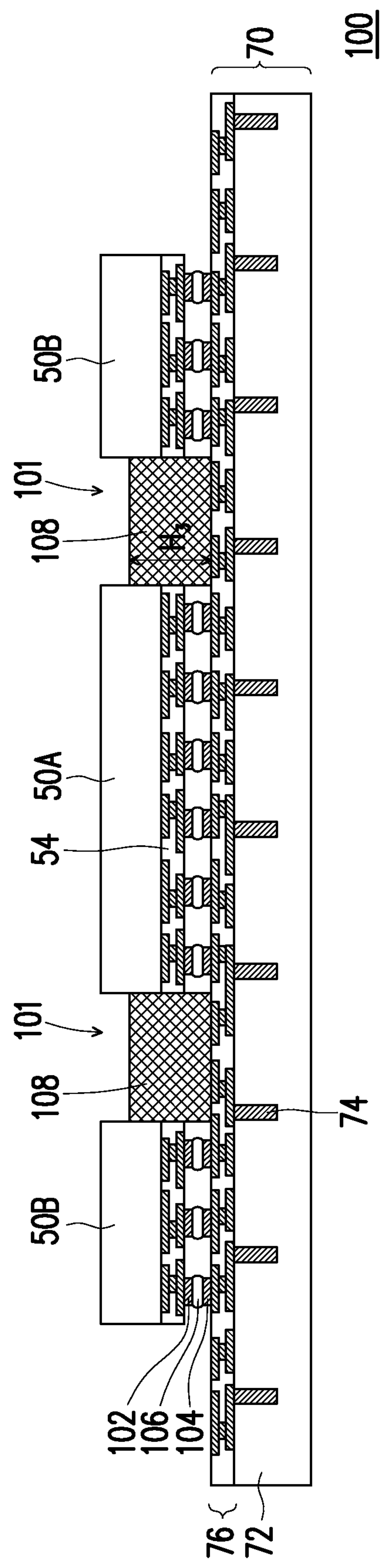

In FIG. 4, dams 108 are formed in the gaps 101 between the integrated circuit devices 50A and 50B. The dams 108 may include a polymeric filler material such as an acrylic, an epoxy, or the like. The polymeric filler material may be an ultraviolet (UV) light curable resin, such as a free radical curing acrylic compound ("acrylates"). In some embodiments, the polymeric filler material is a photo-sensitive monomer, such as a photoresist. In some embodiments, the material of the dams 108 is dispensed on the interposer 70 by, e.g., a printing process such as inkjet printing. The material of the dams 108 may be dispensed at a high temperature with a low viscosity. In some embodiments, the polymeric filler material is dispensed at a temperature of from about 25° C. to about 60° C., and with a viscosity of from about 7 mPa-s to about 12 mPa-s. After the material of the dams 108 is dispensed, a curing process is performed. The curing process may include exposing the polymeric filler material to an ultraviolet light source. In embodiments where the polymeric filler material is a photo-sensitive monomer, such as a photoresist, exposing the photoresist may cause cross-linking between the photo-sensitive monomers. Curing the polymeric filler material may harden the polymeric filler material into a solid material, thereby forming the dams 108. The dams 108 are formed to a height $H_3$. In some embodiments, the height $H_3$ is in the range of from about 20 μm to about 800 μm. The height $H_3$ of the dams 108 may be less than the heights $H_1$ and $H_2$ (see FIG. 3A), or greater than the heights $H_1$ and $H_2$.

Figure 5A:
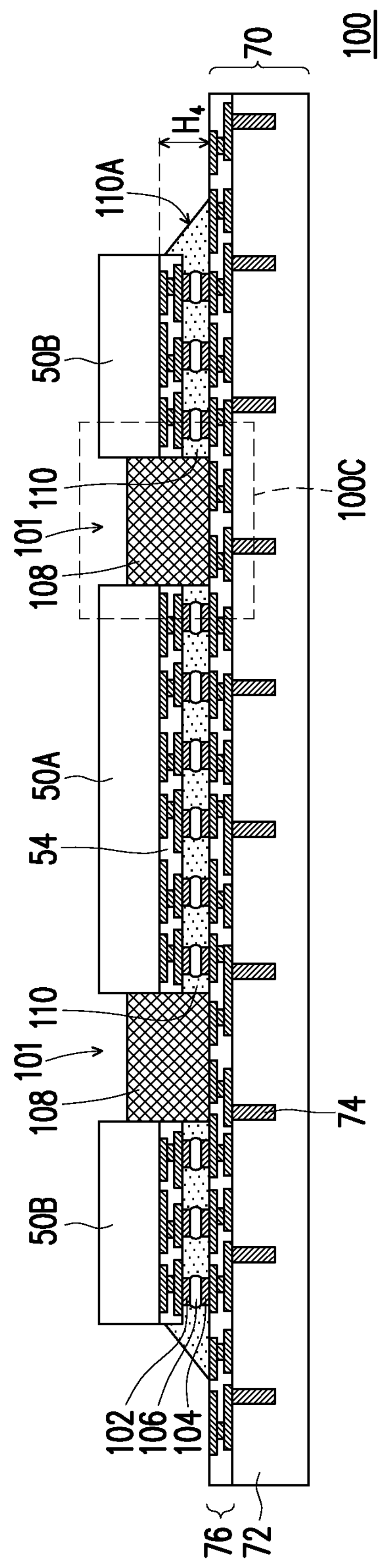

In FIG. 5A, an underfill material 110 is dispensed between the integrated circuit devices 50A and 50B and the interconnect structure 76. The underfill material 110 surrounds the conductive bumps 102 and 104, the conductive connectors 106, and the dams 108. The dams 108 at least partially fill the gaps 101 between the integrated circuit devices 50A and 50B, and prevent the underfill material 110 from completely filling the gaps 101. The dams 108 thus prevent the underfill material 110 from being a single continuous layer. The underfill material 110 has fillets 110A at edge regions of the interposer 70. The fillets 110A extend up along sides of the integrated circuit devices 50B, the sides being those disposed along the edge regions of the interposer 70. The underfill material 110 may be any acceptable material, such as a polymer, epoxy, molding underfill, or the like. The underfill material 110 may be formed by a capillary flow process. The underfill material 110 is formed to a height $H_4$. In some embodiments, the height $H_4$ is in the range of from about 10 μm to about 50 μm. The height $H_4$ of the underfill material 110 is less than the height $H_3$ of the dams 108.

Figure 5B:
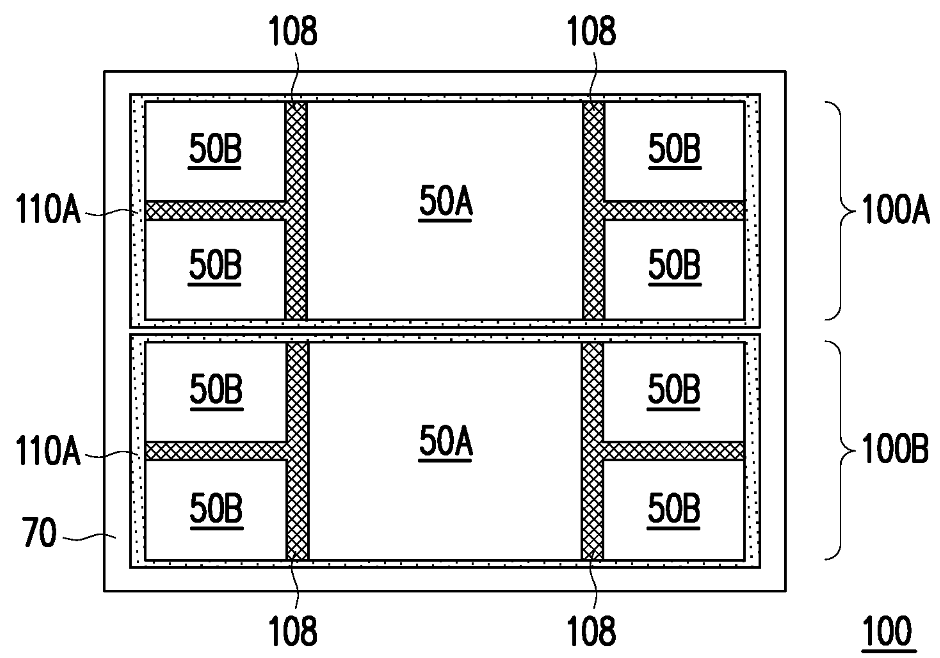
Figure 5C:
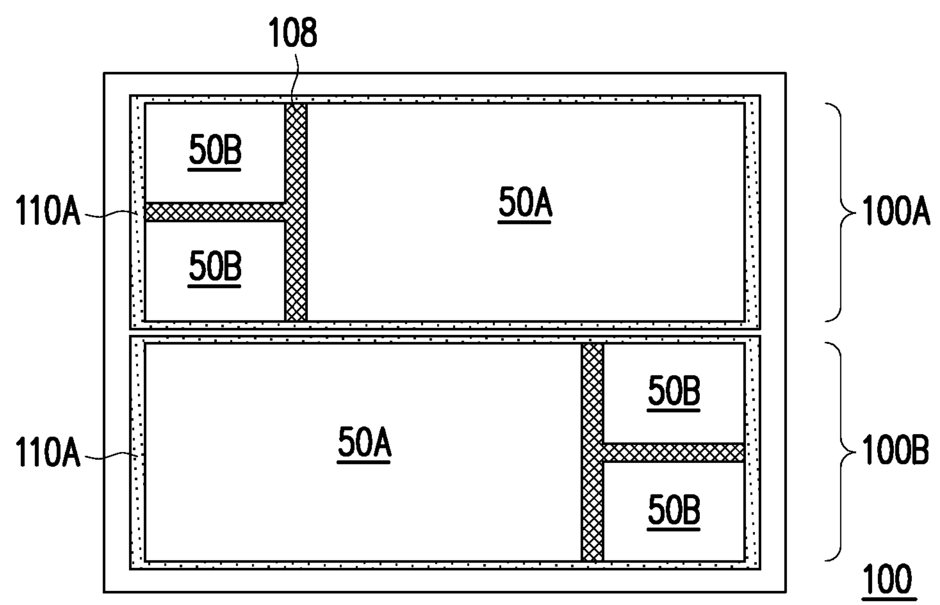
Figure 5D:
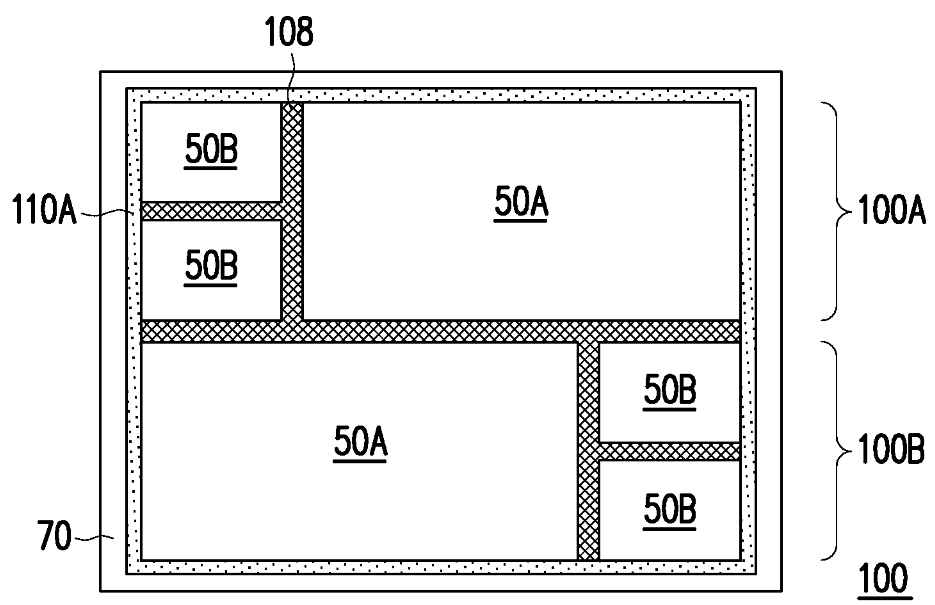

FIGS. 5B and 5C are various top views of the structure of FIG. 5A, showing the regions 100A and 100B. FIGS. 5B and 5C, respectively, illustrate the embodiments of FIGS. 3B and 3C after the dams 108 are formed and the underfill material 110 is dispensed. FIG. 5D is a top view of the structure of FIG. 5A in accordance with some other embodiments. In the embodiment of FIG. 5D, the first fillets 110A are only formed on outermost edges of the wafer, and the dams 108 are also formed between adjacent ones of the regions 100A and 100B.

Figure 6A:
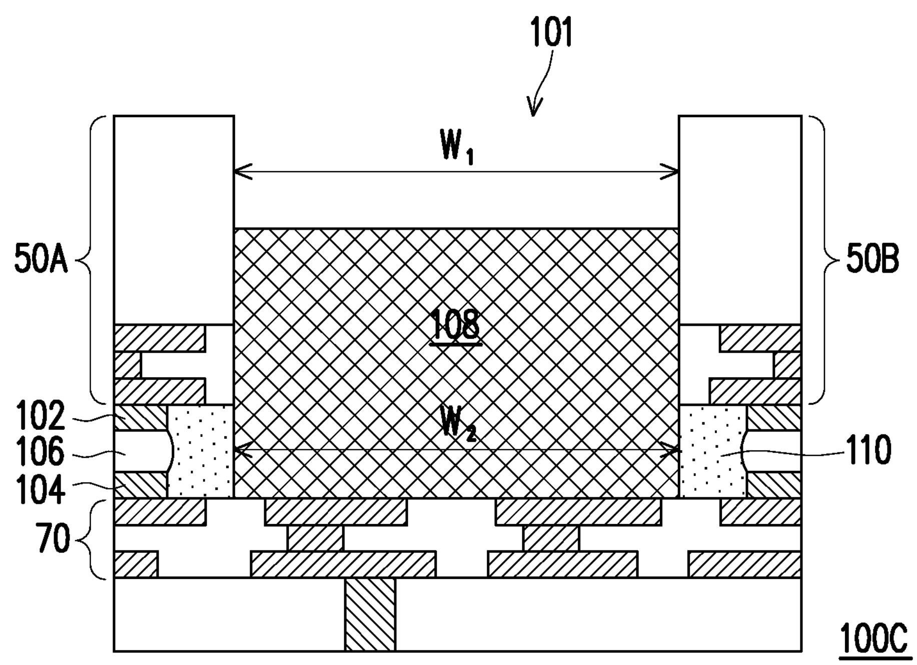
Figure 6B:
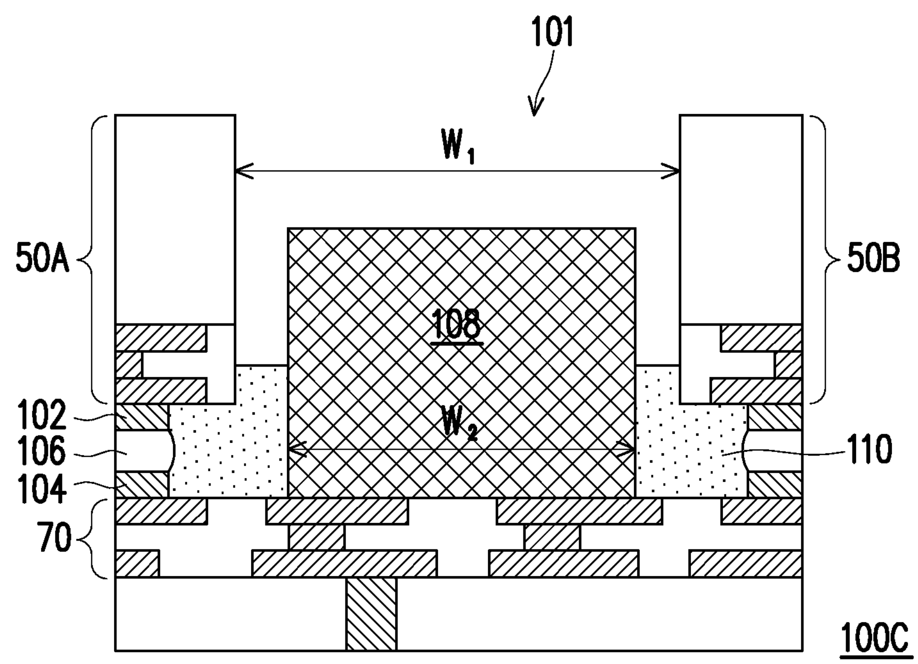
Figure 6C:
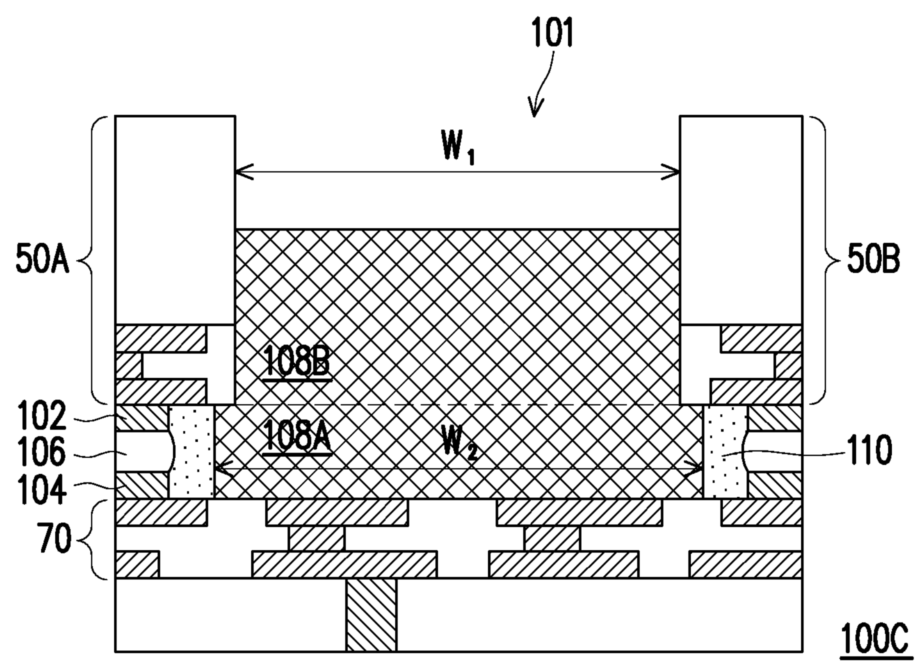

FIGS. 6A, 6B, and 6C are detailed views of a region 100C (see FIG. 5A) of the first device package 100 after the underfill material 110 is dispensed. FIGS. 6A, 6B, and 6C show dimensions of the first device package 100 when the dams 108 are formed to various widths. The dams 108 are formed to a width $W_2$, which in some embodiments, may be in the range of from about 40 μm to about 150 μm. In some embodiments, such as that shown in FIG. 6A, the widths $W_2$ of the dams 108 are equal to the widths $W_1$ of the gaps 101, with the underfill material 110 being substantially confined beneath the integrated circuit devices 50A and 50B (e.g., the underfill material 110 is planar with one of the edges of the integrated circuit devices 50A and 50B). In some embodiments, such as that shown in FIG. 6B, the widths $W_2$ of the dams 108 are less than the widths $W_1$ of the gaps 101, with the underfill material 110 filling portions of the gaps 101. In some embodiments, such as that shown in FIG. 6C, the dams 108 extend partially beneath the integrated circuit devices 50A and 50B, with lower portions 108A of the dams 108 having widths $W_2$ that are greater than the widths $W_1$ of the gaps 101, and upper portions 108B of the dams 108 have the same width $W_1$ as the gaps 101.

Figure 7:
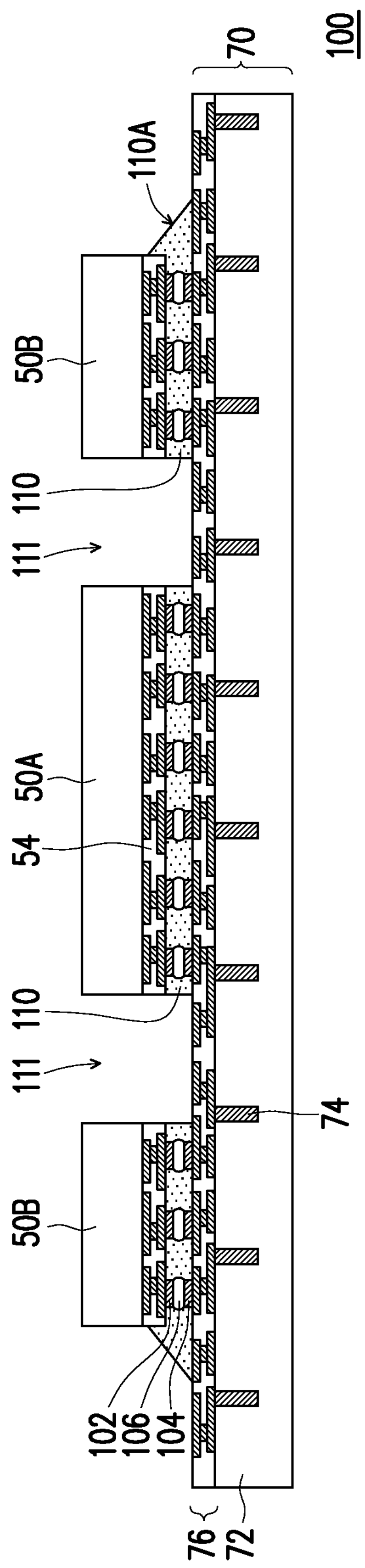

In FIG. 7, the dams 108 are removed. Removing the dams 108 forms underfill breaks 111 in the underfill material 110, between adjacent ones of the integrated circuit devices 50A and 50B. The underfill breaks 111 may be openings in the underfill material 110 that expose the interposer 70. Removal of the dams 108 may be accomplished by acceptable etching processes, using an etchant selective to the polymeric filler material of the dams 108. For example, when the dams 108 are formed from a photoresist, appropriate photoresist strippers may be used to remove material of the dams 108. In some embodiments, the etching process includes a wet etch using a sodium hydroxide (NaOH) based etchant. When a NaOH-based etchant is used, the wet etch may be performed at a temperature in the range of from about 20° C. to about 80° C., and for a time span in the range of from about 30 seconds to about 600 seconds. In some embodiments, the etching includes a wet etch using a potassium hydroxide (KOH) based etchant. When a KOH-based etchant is used, the wet etch may be performed at a temperature in the range of from about 20° C. to about 80° C., and for a time span in the range of from about 30 seconds to about 600 seconds.

The underfill breaks 111 are between the integrated circuit devices 50A and 50B, such that portions of the underfill material 110 under each integrated circuit device 50A and 50B are physically separated. The underfill material 110 may have a large thermal mismatch with materials of the interposer 70, e.g., silicon. Physically separating portions of the underfill material 110 may help lower the thermal mismatch, thus reducing warpage of the first device package 100 during subsequent high-temperature processing, particularly in embodiments where the interposer 70 is formed in a wafer. In one example, warpage was reduced by as much as 40%.

Figure 8:
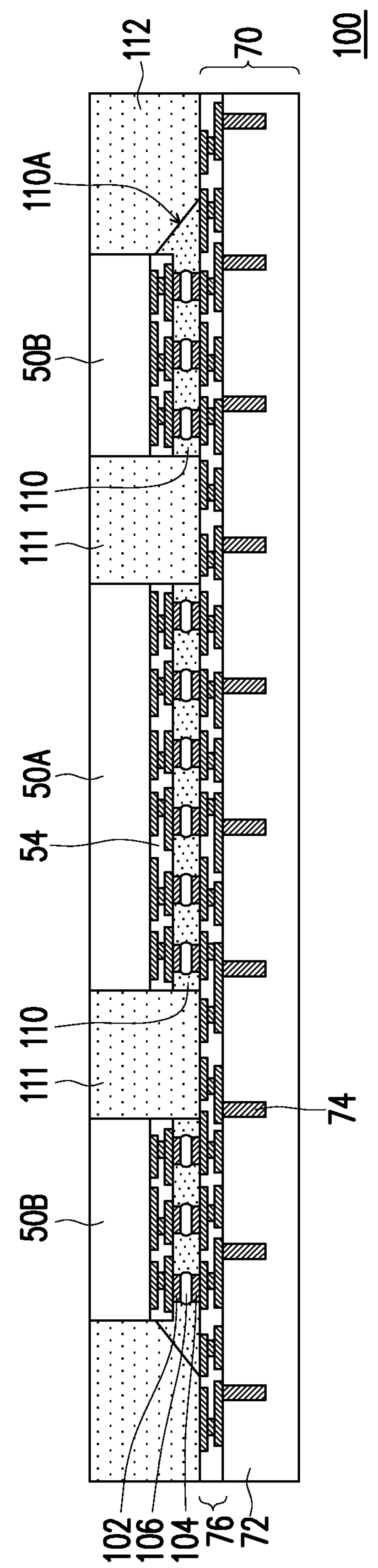

In FIG. 8, an encapsulant 112 is formed on the various components. The encapsulant 112 may be a molding compound, epoxy, or the like, and may be applied by compression molding, transfer molding, or the like. The encapsulant 112 may be formed over the interconnect structure 76 such that the integrated circuit devices 50A and 50B and the underfill material 110 are buried or covered. The encapsulant 112 is further formed in the underfill breaks 111. The encapsulant 112 is then cured. In some embodiments, the encapsulant 112 is thinned such that top surfaces of the encapsulant 112 and integrated circuit devices 50A and 50B are level. As noted above, physically separating portions of the underfill material 110 may reduce warpage of the first device package 100. Reducing warpage may increase the processing window for forming and thinning the encapsulant 112.

Breaking the underfill material 110 by forming and removing the dams 108 may have advantages over other methods of forming the underfill breaks 111. For example, forming the underfill breaks 111 by forming and removing the dams 108 (instead of cutting the underfill material 110) may avoiding cracking in the integrated circuit devices 50A and 50B, cracking in the encapsulant 112, or delamination at the interface of the underfill material 110 and encapsulant 112. Similarly, such formation methods may allow the underfill breaks 111 to be formed even when the integrated circuit devices 50A and 50B are asymmetrically placed, such as in the embodiment of FIG. 3C. Indeed, forming and removing the dams 108 may allow the underfill breaks 111 to be formed in packages with any acceptable device layout.

Figure 9A:
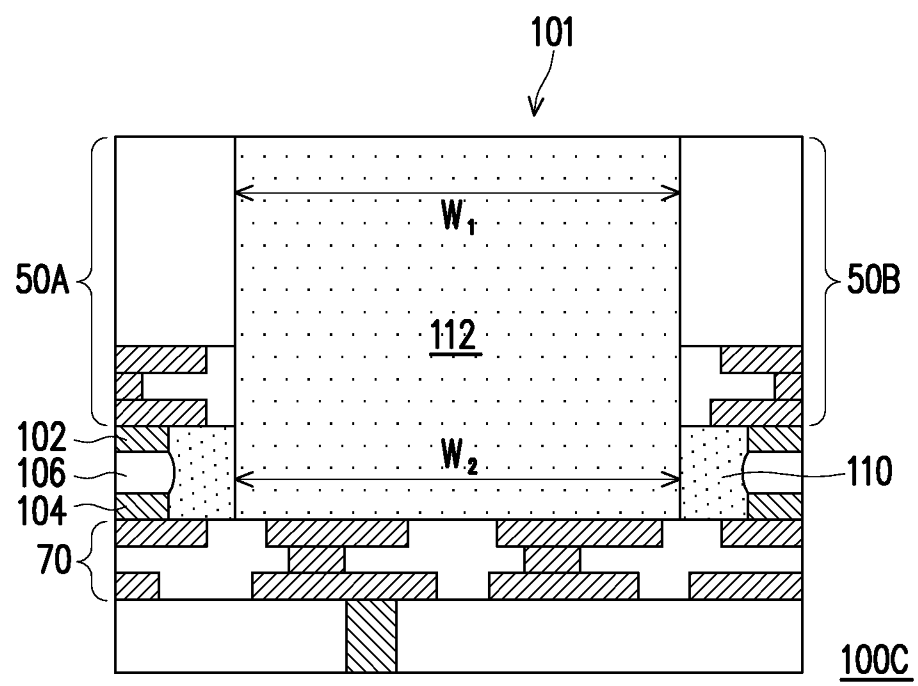
Figure 9B:
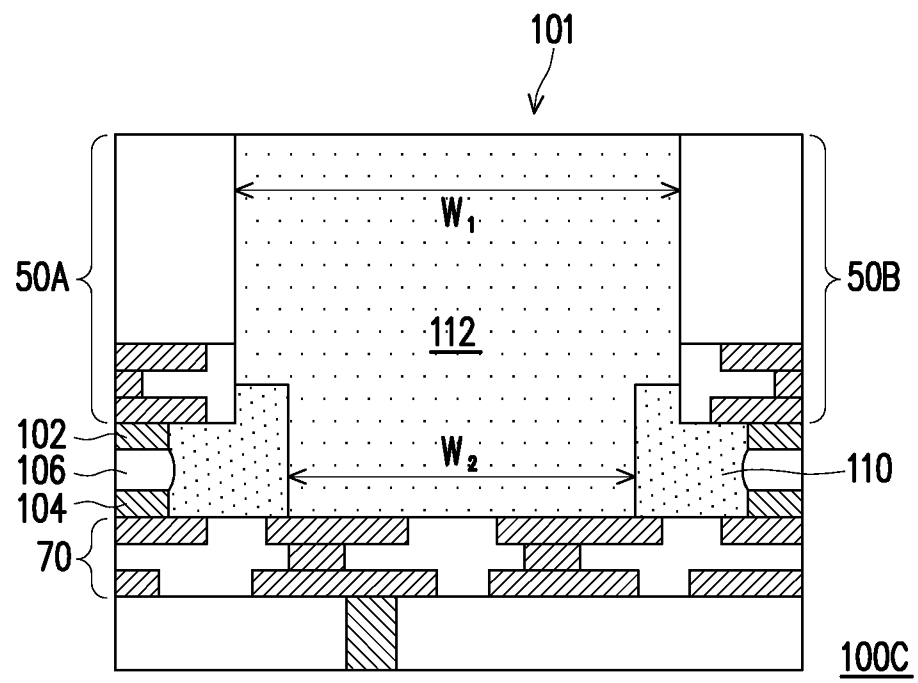
Figure 9C:
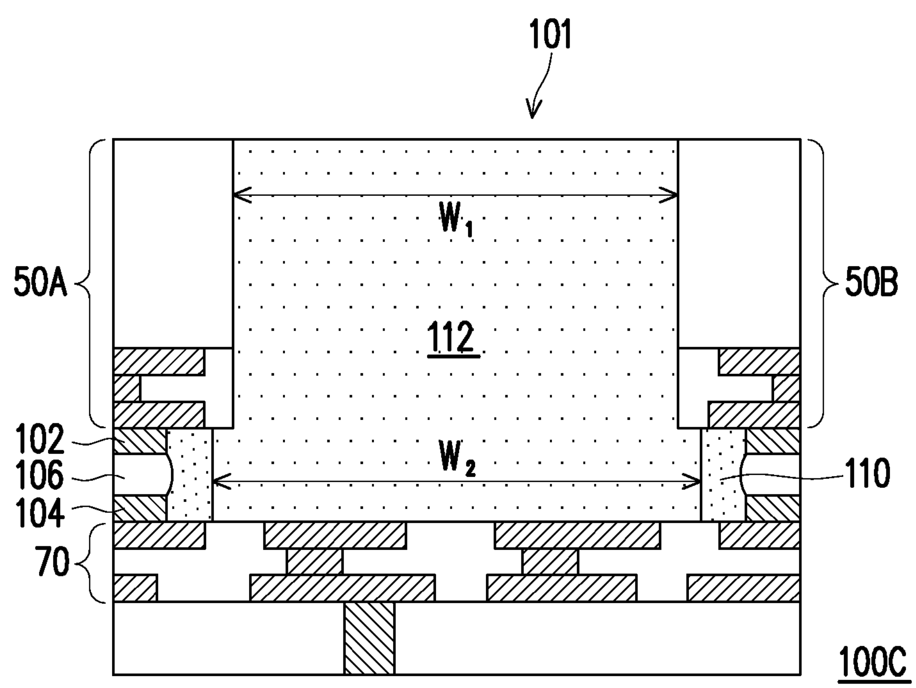

FIGS. 9A, 9B, and 9C are detailed view of a region 100C (see FIG. 5A) of the first device package 100. FIGS. 9A, 9B, and 9C, respectively, illustrate the embodiments of FIGS. 6A, 6B, and 6C after the encapsulant 112 is cured and thinned. The encapsulant 112 fills portions of the gaps 101 unoccupied by the underfill material 110. Notably, portions of the encapsulant 112 fill portions of the gaps 101 previously occupied by the dams 108. In FIG. 9A, the widths $W_2$ of the portions of the encapsulant 112 in the gaps 101 are equal to the widths $W_1$ of the gaps 101. In FIG. 9B, the widths $W_2$ of the portions of the encapsulant 112 in the gaps 101 are less than the widths $W_1$ of the gaps 101. In FIG. 9C, the portions of the encapsulant 112 in the gaps 101 have lower widths $W_2$ that are greater than the widths $W_1$ of the gaps 101, and have upper width that are the same width $W_1$ as the gaps 101.

Figure 10:
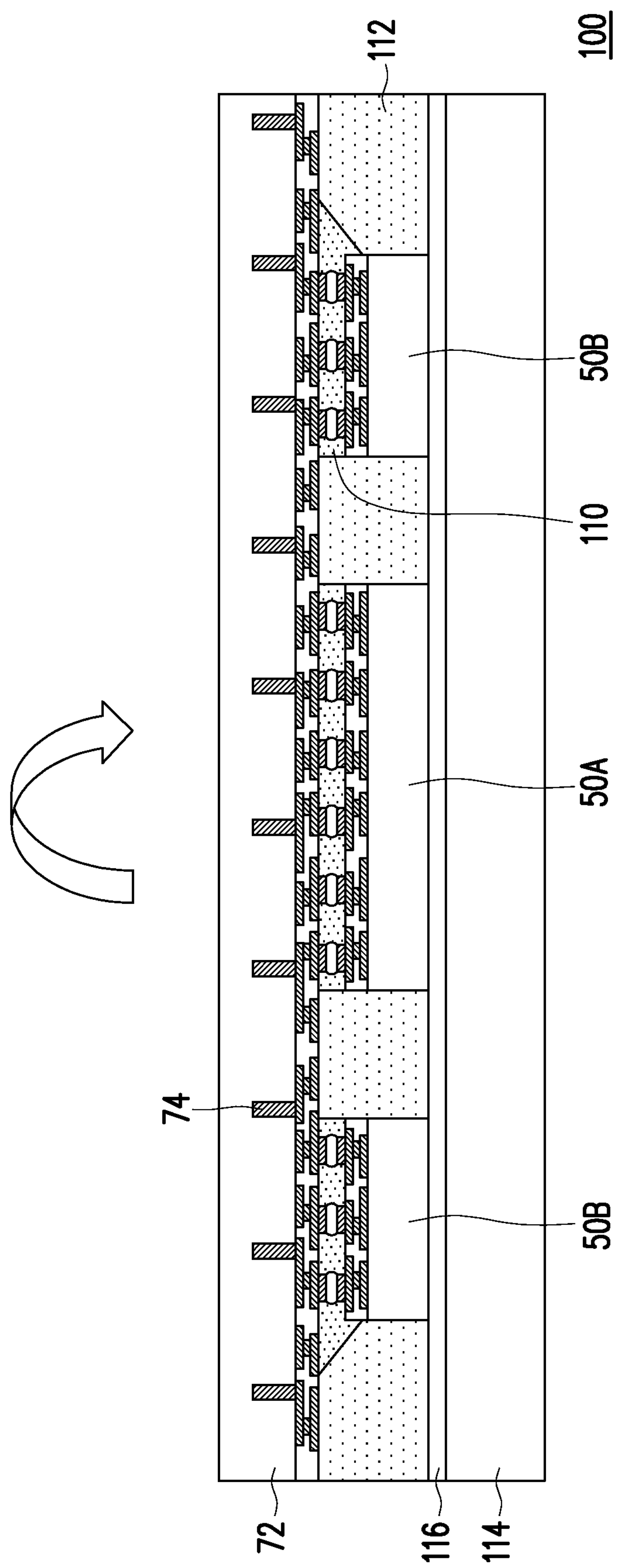

In FIG. 10, the intermediate structure is flipped over to prepare for processing of the back side of the substrate 72. The intermediate structure may be placed on a carrier substrate 114 or other suitable support structure for subsequent processing. For example, the carrier substrate 114 may be attached to the encapsulant 112. The intermediate structure may be attached to the carrier substrate 114 by a release layer 116. The release layer 116 may be formed of a polymer-based material, which may be removed along with the carrier substrate 114 from the overlying structures. In some embodiments, the carrier substrate 114 is a substrate such as a bulk semiconductor or a glass substrate, and may have any thickness, such as a thickness of about 300 mm. In some embodiments, the release layer 116 is an epoxy-based thermal-release material, which loses its adhesive property when heated, such as a light-to-heat-conversion (LTHC) release coating.

Figure 11:
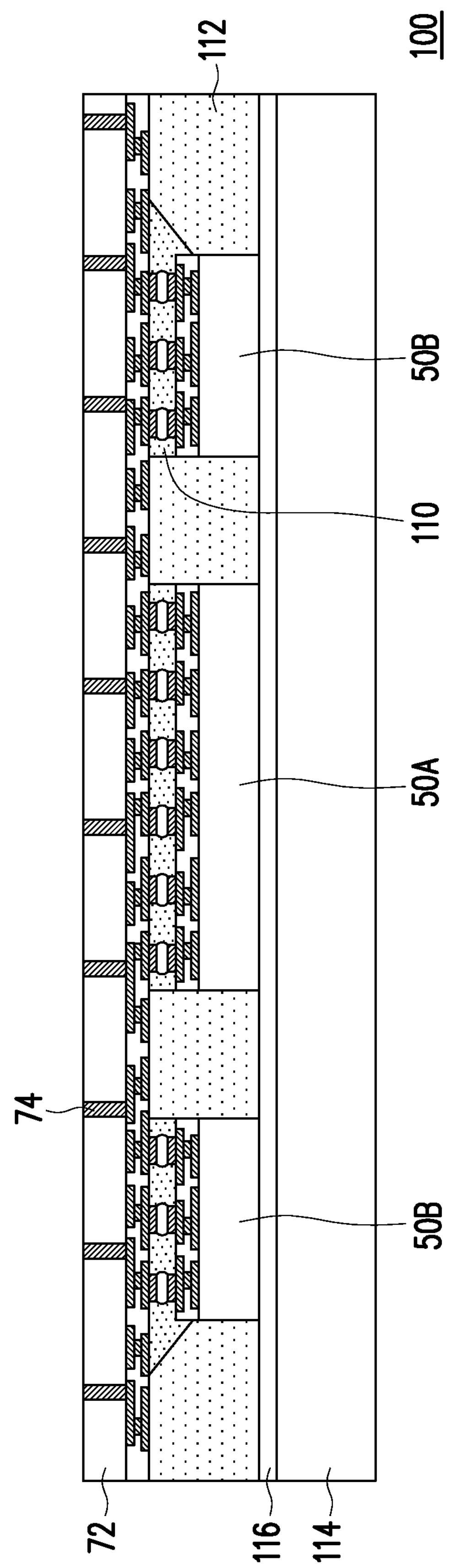

In FIG. 11, the substrate 72 is thinned to expose the through vias 74. In some embodiments, exposed surfaces of the substrate 72 and through vias 74 are level. Exposure of the through vias 74 may be accomplished by a thinning process, such as a grinding process, a chemical-mechanical polish (CMP), or other acceptable removal process. In some embodiments (not shown), a recessing process may be performed to recess the substrate 72 such that the through vias 74 protrude from the back side of the substrate 72. The recessing process may be, e.g., a suitable etch-back process. An insulating layer may be formed on the back side of the substrate 72, surrounding and protecting the protruding portions of the through vias 74.

Figure 12:
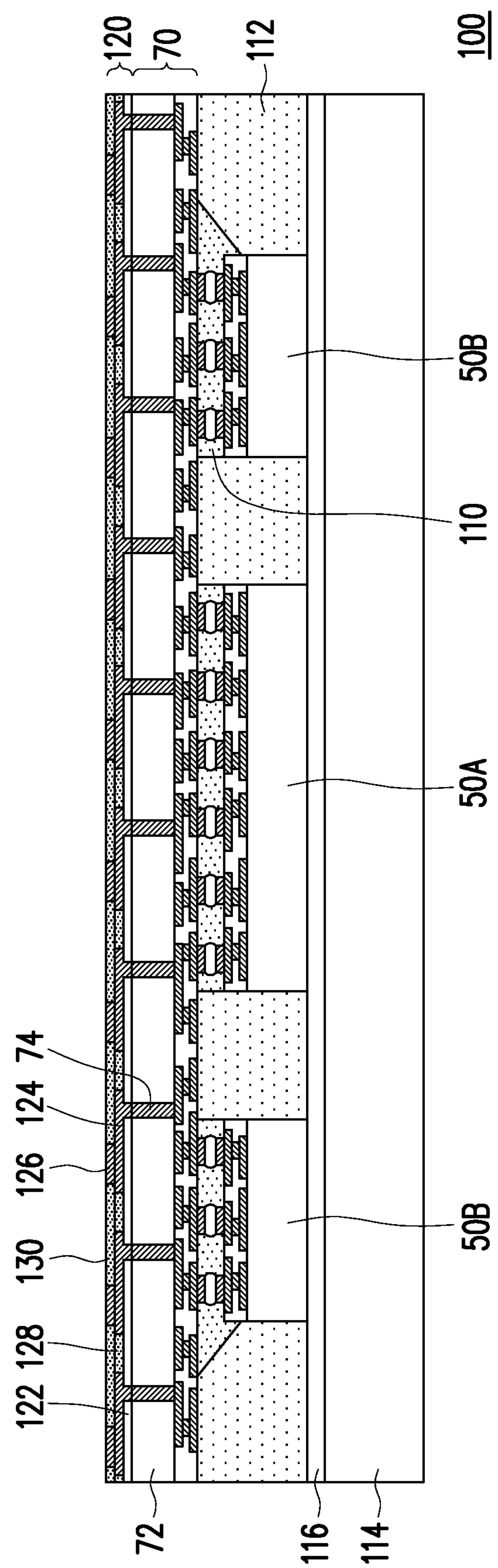

In FIG. 12, a redistribution structure 120 is formed over the back side of the substrate 72. The redistribution structure 120 includes a dielectric layer 122, under bump metallurgies (UBMs) 124, and conductive bumps 126. The redistribution structure 120 is shown as an example. More or fewer dielectric layers and conductive layers may be formed in the redistribution structure 120. If more dielectric layers and metallization patterns are to be formed, steps and processes discussed below may be repeated.

As an example to form the redistribution structure 120, the dielectric layer 122 is deposited on the back side of the substrate 72 and the through vias 74. In some embodiments, the dielectric layer 122 is formed of a photo-sensitive material such as polybenzoxazole (PBO), polyimide, benzocyclobuten (BCB), or the like, which may be patterned using a lithography mask. The dielectric layer 122 may be formed by spin coating, lamination, CVD, the like, or a combination thereof. The dielectric layer 122 is then patterned. The patterning forms openings exposing portions of the through vias 74. The patterning may be by an acceptable process, such as by exposing the dielectric layer 122 to light when the dielectric layer 122 is a photo-sensitive material or by etching using, for example, an anisotropic etch. If the dielectric layer 122 is a photo-sensitive material, the dielectric layer 122 can be developed after the exposure.

The UBMs 124 are then formed. The UBMs 124 include conductive lines on and extending along the major surface of the dielectric layer 122. The UBMs 124 further include conductive vias extending through the dielectric layer 122 to be physically and electrically connected to the through vias 74. A seed layer (not shown) is formed over the dielectric layer 122 and in the openings extending through the dielectric layer 122. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A first photoresist 128 is then formed and patterned on the seed layer. The first photoresist 128 may be formed by spin coating or the like and may be exposed to light for patterning. The pattern of the first photoresist 128 corresponds to the UBMs 124. The patterning forms openings through the first photoresist 128 to expose the seed layer. A conductive material is then formed in the openings of the first photoresist 128 and on the exposed portions of the seed layer. The conductive material may be formed by plating, such as electroplating or electroless plating, or the like. The conductive material may include a metal, such as copper, titanium, tungsten, aluminum, or the like. The combination of the conductive material and underlying portions of the seed layer forms the UBMs 124.

The conductive bumps 126 are then formed. A second photoresist 130 is formed and patterned on the UBMs 124 and first photoresist 128. The second photoresist 130 may be similar to the first photoresist 128. The second photoresist 130 may be exposed to light for patterning. The pattern of the second photoresist 130 corresponds to the conductive bumps 126. The patterning forms openings through the second photoresist 130, exposing portions of the UBMs 124. A conductive material is then formed in the openings of the second photoresist 130 and on the exposed portions of the UBMs 124. The conductive material may be formed by plating, such as electroplating or electroless plating, or the like. The conductive material may include a metal, such as copper, titanium, tungsten, aluminum, or the like. Because the UBMs 124 are exposed by the openings in the second photoresist 130, no seed layer is formed in the openings. Rather, the conductive material is formed directly and physically on the UBMs 124. The conductive material is formed by performing a plating process with the same plating process parameters as the plating process used to form the conductive material of the UBMs 124. Notably, no seed layer is formed between the UBMs 124 and conductive bumps 126. Rather, the conductive material of the conductive bumps 126 is formed by performing a plating process using the seed layer of the UBMs 124.

Figure 13:
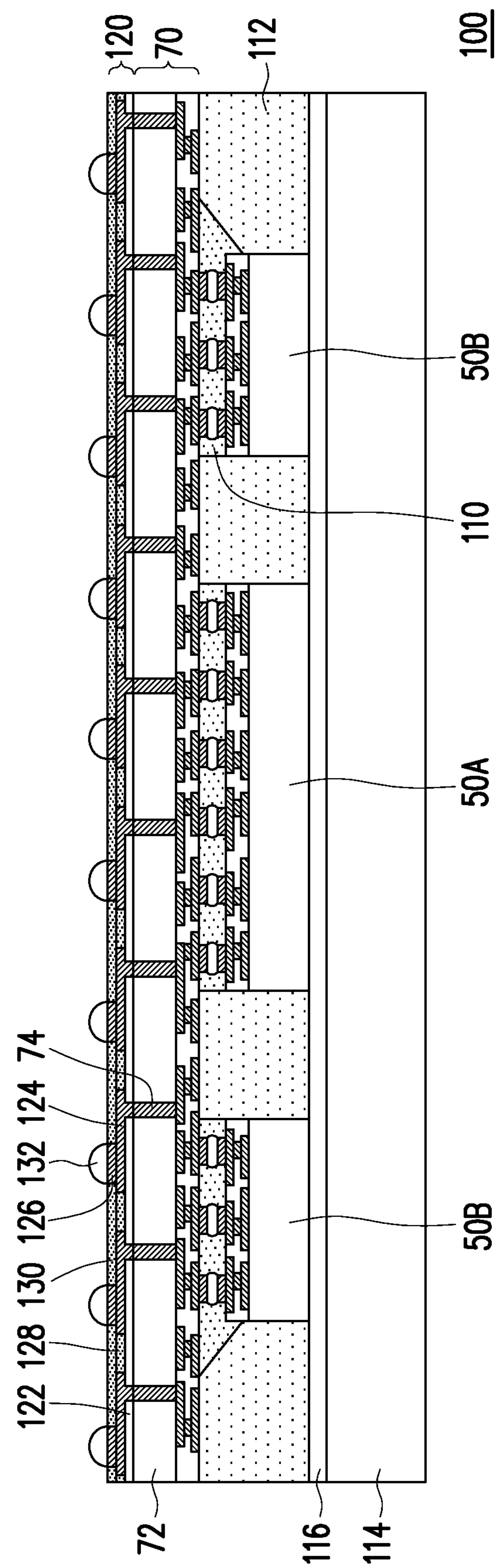

In FIG. 13, conductive connectors 132 are formed on the conductive bumps 126. The conductive connectors 132 may be formed from a conductive material such as solder, and may be formed by initially forming a layer of solder on the conductive bumps 126 through methods such as evaporation, electroplating, printing, solder transfer, ball placement, or the like. Once the layer of solder has been formed, a reflow process may be performed in order to shape the conductive connectors 132 into desired bump shapes. The conductive connectors 132 may be ball grid array (BGA) connectors, solder balls, controlled collapse chip connection (C4) bumps, or the like. The UBMs 124 laterally offset the conductive connectors 132 from the through vias 74. Because no seed layer is formed between the UBMs 124 and the conductive bumps 126, the conductive bumps 126 are a conductive material extending continuously from the UBMs 124 to the conductive connectors 132.

Figure 14:
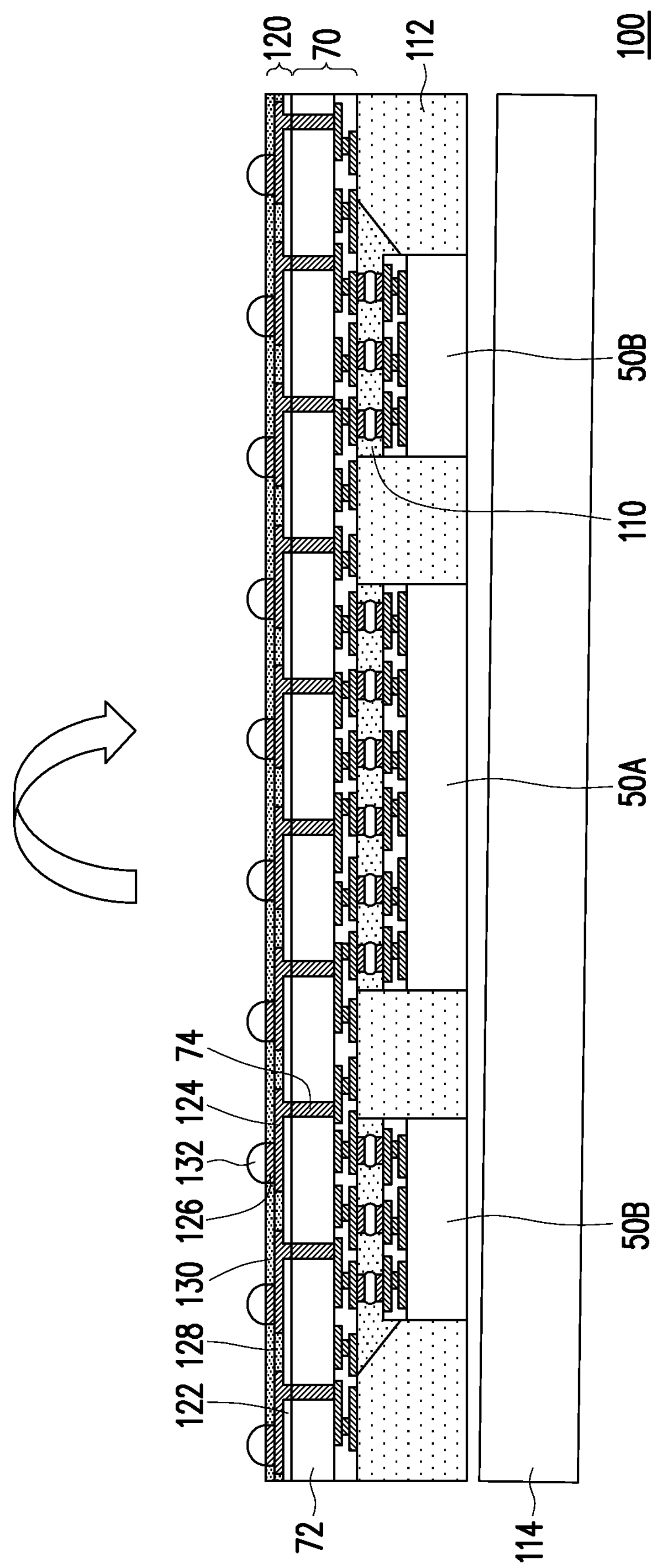
Figure 15:
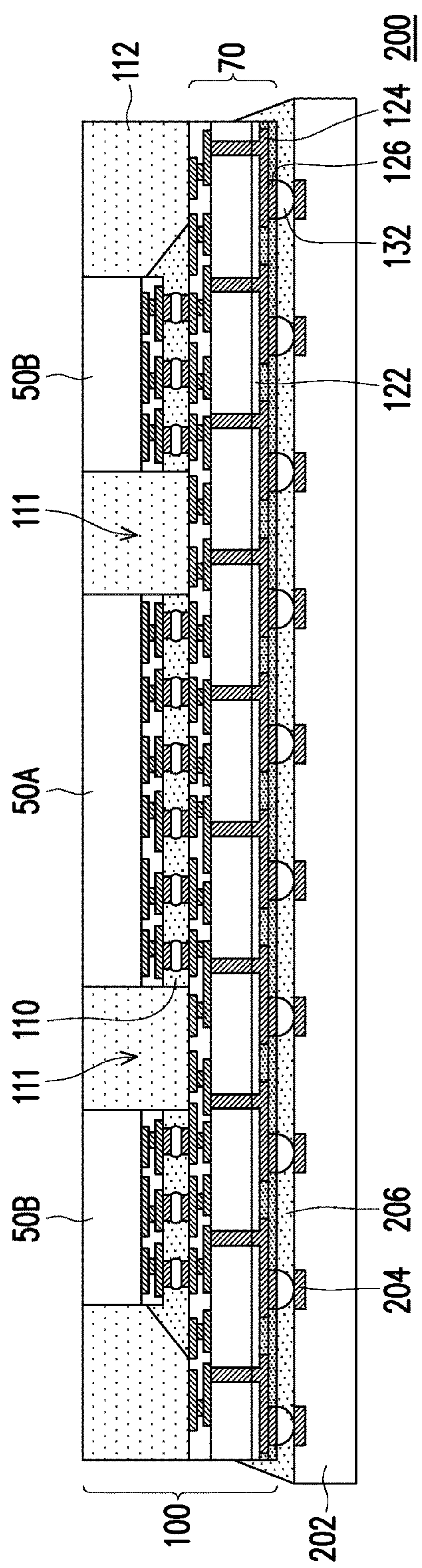

In FIG. 14, a carrier de-bonding is performed to detach (de-bond) the carrier substrate 114 from the encapsulant 112. In accordance with some embodiments, the de-bonding includes projecting a light such as a laser light or an ultraviolet (UV) light on the release layer 116 so that the release layer 116 decomposes under the heat of the light and the carrier substrate 114 can be removed. The structure is then flipped over and placed on a tape. Subsequently, the interposer 70 is singulated along scribe line regions between adjacent device regions to form the first device package 100. The singulation may be by sawing, dicing, or the like. As a result of the singulation process, edges of the interposer 70 and encapsulant 112 are coterminous. In other words, the outer sidewalls of the interposer 70 have the same width as the outer sidewalls of the encapsulant 112. The first photoresist 128 and second photoresist 130 may optionally be removed before or after the carrier de-bonding.

In FIG. 15, a second device package 200 is formed by mounting the first device package 100 to a package substrate 202. The package substrate 202 may be made of a semiconductor material such as silicon, germanium, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. In some embodiments, a SOI substrate includes a layer of a semiconductor material such as epitaxial silicon, germanium, silicon germanium, SOI, or combinations thereof. The package substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 202.

The package substrate 202 may include active and passive devices. As one of ordinary skill in the art will recognize, a wide variety of devices such as transistors, capacitors, resistors, combinations of these, and the like may be used to generate the structural and functional requirements of the design for the second device package 200. The devices may be formed using any suitable methods.

The package substrate 202 may also include metallization layers and vias and bond pads 204 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 202 is substantially free of active and passive devices.

The conductive connectors 132 are reflowed to attach the first device package 100 to the bond pads 204, thereby bonding the interposer 70 to the package substrate 202. The conductive connectors 132 electrically and physically couple the package substrate 202, including metallization layers in the package substrate 202, to the first device package 100. As noted above, physically separating portions of the underfill material 110 may reduce warpage of the first device package 100. Stand-off height variation between the package substrate 202 and interposer 70 may thus be reduced, which may help avoid cold joints and bridging when reflowing the conductive connectors 132. Manufacturing yield may thus be improved.

The conductive connectors 132 may have an epoxy flux formed thereon before they are reflowed, with at least some of the epoxy portion of the epoxy flux remaining after the first device package 100 is attached to the package substrate 202. This remaining epoxy portion may act as an underfill to reduce stress and protect the joints resulting from the reflowing the conductive connectors 132.

In some embodiments, passive devices (e.g., surface mount devices (SMDs), not illustrated) are attached to the second device package 200 (e.g., bonded to the bond pads 204) prior to mounting on the package substrate 202. In such embodiments, the passive devices may be bonded to a same surface of the package substrate 202 as the conductive connectors 132.

An underfill 206 may be formed between the first device package 100 and the package substrate 202, surrounding the conductive connectors 132, conductive bumps 126, and UBMs 124. Due to the process for forming the UBMs 124, they are not surrounded by dielectric or insulating layers after formation. As such, the underfill 206 directly contacts and extends along sides of the UBMs 124. Further, the underfill 206 is a continuous material extending from the package substrate 202 to the dielectric layer 122. The underfill 206 may be formed by a capillary flow process after the first device package 100 is attached or may be formed by a suitable deposition method before the first device package 100 is attached.

Optionally, a heat spreader may be attached to the second device package 200, covering and surrounding the first device package 100. The heat spreader may be formed from a material with high thermal conductivity, such as steel, stainless steel, copper, the like, or combinations thereof. The heat spreader protects the first device package 100 and forms a thermal pathway to conduct heat from the various components of the second device package 200.

FIGS. 16A through 16D are cross-section views of intermediate steps during a process for forming stacked semiconductor devices, in accordance with some other embodiments. The embodiment of FIGS. 16A through 16D is similar to the embodiment of FIGS. 3A through 14, and details of similar features will not be repeated.

Figure 16A:
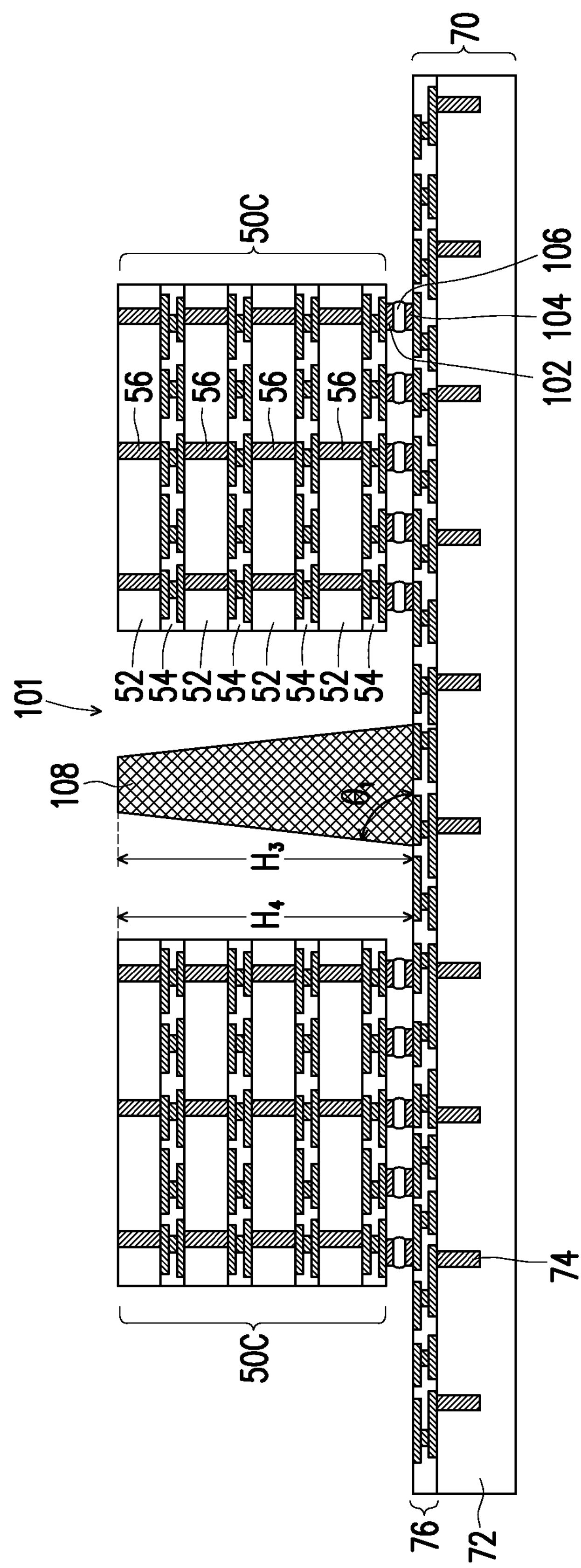
FIGS. 16A through 16D are cross-section views of intermediate steps during a process for forming stacked semiconductor devices, in accordance with some other embodiments.

FIG. 16A shows the first device package 100 after the dams 108 are formed. In the embodiment of FIGS. 16A through 16D, the integrated circuit devices 50 include multiple devices 50C with the same or different functions. The integrated circuit devices 50C are stacked devices that include multiple substrates 52 connected by TSVs 56. The integrated circuit devices 50C may be HMC modules, or HBM modules, or other stacked devices with a large vertical height. Back surfaces of the integrated circuit devices 50C are disposed a height $H_4$ from the interconnect structure 76. In some embodiments, the height $H_4$ is in the range of from about 50 μm to about 800 μm. The dams 108 also have a greater height $H_3$ than the embodiments of FIGS. 1 through 15, and the height $H_3$ may be less than or greater than the height $H_4$. In some embodiments, the height $H_3$ is in the range of from about 20 μm to about 800 μm. As a result of the larger height $H_3$, the dams 108 may have tapered sides, such that the sides of the dams 108 form an acute angle $\theta_1$ with a plane parallel to the front surface of the interposer 70. In some embodiments, the acute angle $\theta_1$ is in the range of from about 70 degrees to about 90 degrees. In other words, top widths of the dams 108 are less than bottom widths of the dams 108.

Figure 16B:
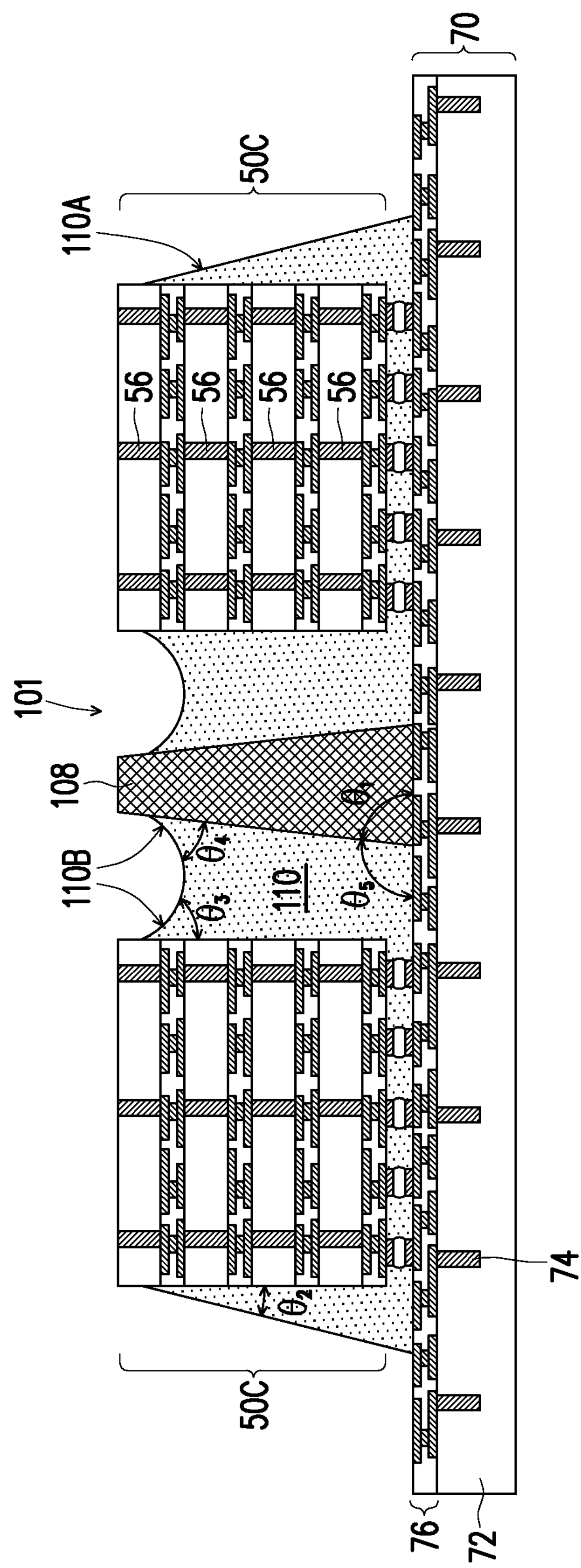

FIG. 16B shows the first device package 100 after the underfill material 110 is dispensed. The underfill material 110 has first fillets 110A at edge regions of the interposer 70. As a result of the larger height $H_3$, the underfill material 110 also has second fillets 110B at edge regions adjacent the dams 108. The first fillets 110A and the second fillets 110B are different sizes. Outer sides of the first fillets 110A form an angle $\theta_2$ with a plane parallel to the sides of the integrated circuit devices 50C. In some embodiments, the angle $\theta_2$ is in the range of from about 30 degrees to about 60 degrees. Outer sides of the second fillets 110B form an angle $\theta_3$ with a plane parallel to the sides of the integrated circuit devices 50C. In some embodiments, the angle $\theta_3$ is in the range of from about 30 degrees to about 60 degrees. The second fillets 110B also form an angle $\theta_4$ with a plane parallel to the sides of the dams 108. In some embodiments, the angle $\theta_4$ is in the range of from about 30 degrees to about 60 degrees. The angle $\theta_3$ may be equal to or different from the angle $\theta_4$. In some embodiments, the angles $\theta_3$ and $\theta_4$ are greater than the angle $\theta_2$. In some embodiments, the angle $\theta_3$ is greater than the angle $\theta_4$. Further, the underfill material 110 has a concave topmost surface formed by the second fillets 110B. Because the angle $\theta_1$ is acute, upper portions of the second fillets 110B are wider than lower portions of the second fillets 110B, and the second fillets 110B have an interior angle $\theta_5$ that is obtuse.

Figure 16C:
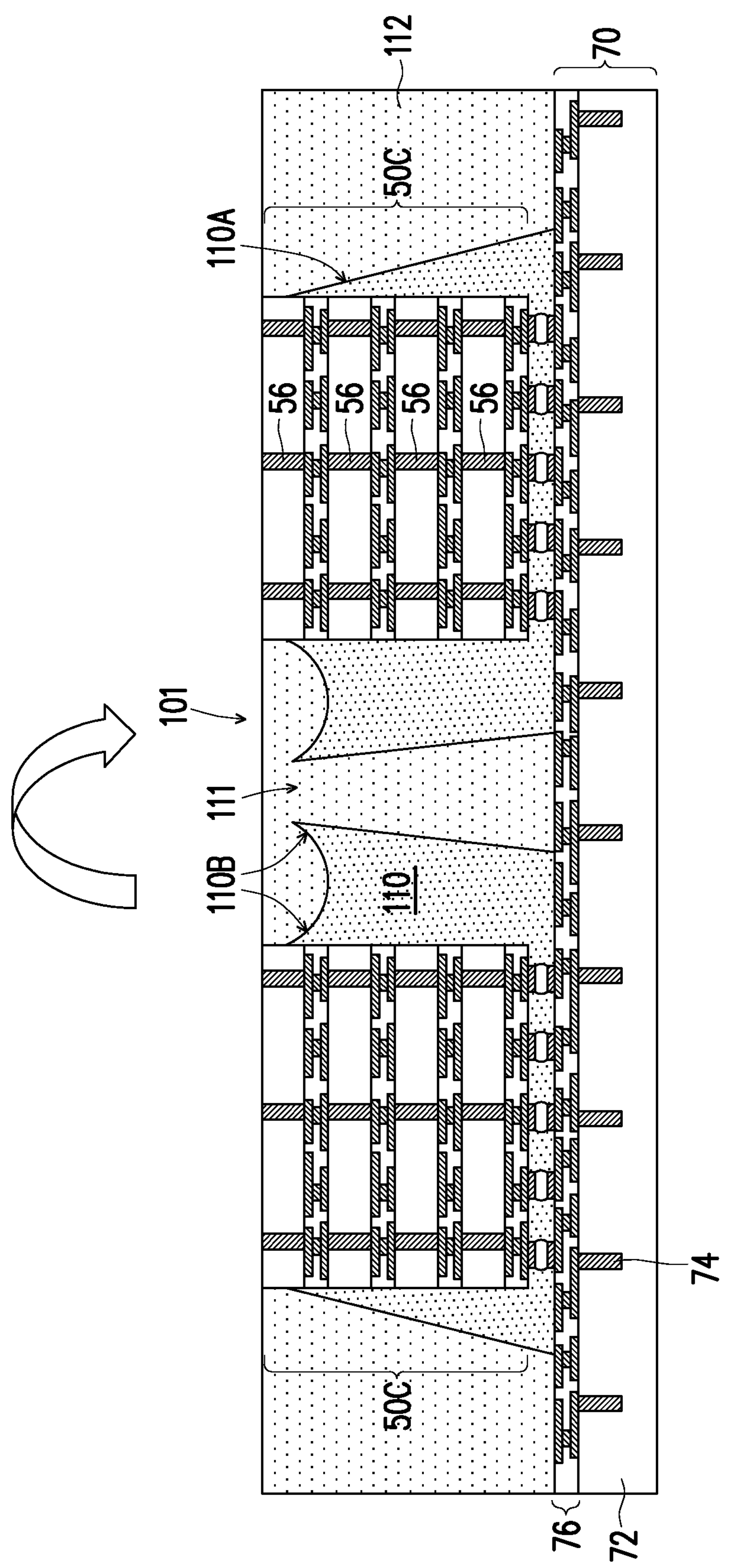

FIG. 16C shows the first device package 100 after the dams 108 are removed and the encapsulant 112 is formed. Portions of the encapsulant 112 in the underfill breaks 111 have the same shape as the dams 108. The portions of the encapsulant 112 in the underfill breaks 111 have a straight portion, and a curved portion (formed by the second fillets 110B). The structure is then flipped over and placed on a tape.

Figure 16D:
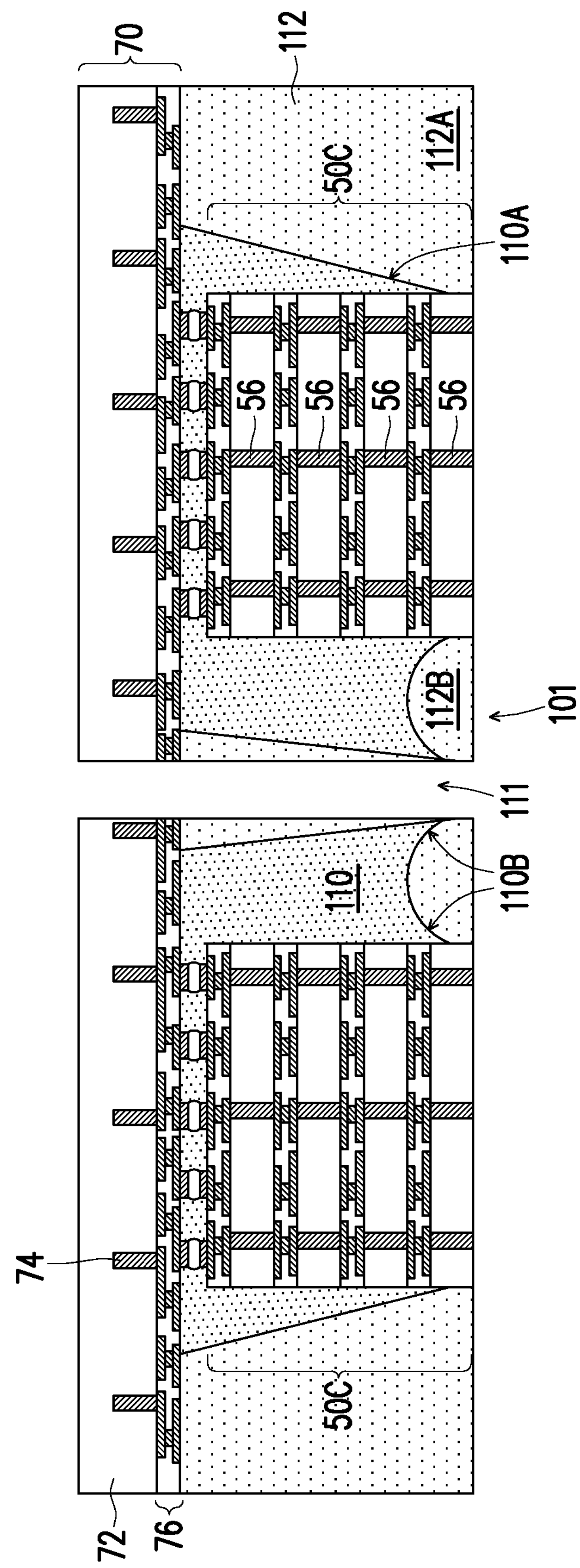

FIG. 16D shows the first device package 100 after a singulation process. The interposer 70 is singulated along scribe line regions between adjacent device regions to form device packages. The scribe line regions may be in the underfill breaks 111, between the second fillets 110B. The singulation may be by sawing, dicing, or the like. As a result of the singulation process, the encapsulant 112 has first regions 112A along the first fillets 110A, and second regions 112B along the second fillets 110B. The second regions 112B have convex surfaces interfacing with the concave surfaces of the second fillets 110B.

Figure 17:
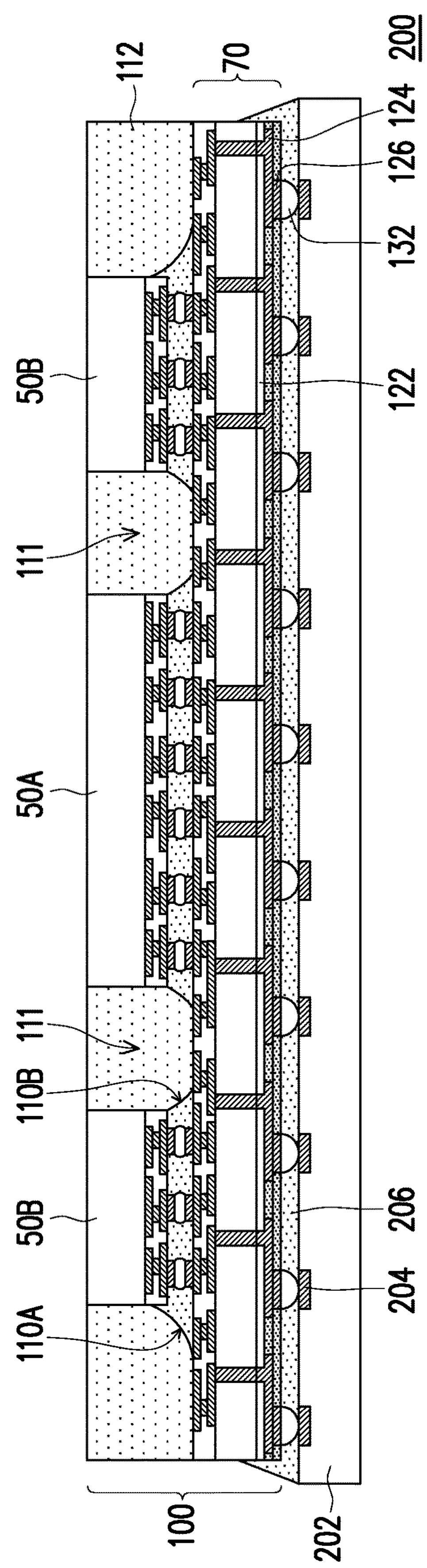
FIG. 17 is a cross-section view of a stacked semiconductor device, in accordance with some other embodiments.

FIG. 17 is a cross-section view of a stacked semiconductor device, in accordance with some other embodiments. The embodiment of FIG. 17 is similar to the embodiment of FIG. 9B, except portions of the underfill material 110 beneath edge dies (e.g., the integrated circuit devices 50B) have fillets 110A and 110B with different arc lengths. In particular, arc lengths of the fillets 110A are longer than arc lengths of the fillets 110B. Further, portions of the underfill material 110 beneath center dies (e.g., the integrated circuit devices 50A) have fillets 110B with the same arc length.

Embodiments may achieve advantages. Physically separating portions of the underfill material 110 with the underfill breaks 111 may reduce warpage of the first device package 100 during high-temperature processing. Breaking the underfill material 110 by forming and removing the dams 108 may have advantages over other methods of forming the underfill breaks 111. In particular, use of the dams 108 may help avoid cracking and delamination within the first device package 100.

In an embodiment, a method includes: attaching a plurality of integrated circuit devices to a first surface of an interposer, the integrated circuit devices being laterally separated by respective gaps; forming a filler material in the gaps to form dams in the gaps; dispensing an underfill material between the integrated circuit devices and the interposer; removing the dams to form underfill breaks in the underfill material; and encapsulating the integrated circuit devices with an encapsulant, the encapsulant being disposed in the underfill breaks.

In some embodiments of the method, forming the filler material in the gaps includes: dispensing an ultraviolet curable resin in the gaps; and curing the ultraviolet curable resin to form the dams. In some embodiments of the method, curing the ultraviolet curable resin includes: exposing the ultraviolet curable resin to an ultraviolet light source. In some embodiments of the method, curing the filler material increases the viscosity of the ultraviolet curable resin. In some embodiments of the method, the ultraviolet curable resin is an acrylate. In some embodiments of the method, after removing the dams, the underfill material includes fillets along first sides of a subset of the integrated circuit devices, the first sides being disposed along edge regions of the interposer. In some embodiments of the method, the encapsulant extends along second sides of the subset of the integrated circuit devices. In some embodiments, the method further includes: forming a redistribution structure on a second surface of the interposer; and attaching a package substrate to the redistribution structure with conductive connectors.

In an embodiment, a method includes: attaching a first integrated circuit device and a second integrated circuit device to a first surface of an interposer, the first integrated circuit device and the second integrated circuit device being separated by a gap; forming a dam in the gap; forming an underfill on the interposer, the underfill having a first portion beneath the first integrated circuit device, the underfill having a second portion beneath the second integrated circuit device, the dam physically separating the first portion from the second portion; removing the dam to form an opening exposing the interposer; and encapsulating the first integrated circuit device and the second integrated circuit device with an encapsulant, the encapsulant being disposed in the opening.

In some embodiments of the method, a width of the dam is less than a width of the gap. In some embodiments of the method, a width of the dam is equal to a width of the gap. In some embodiments of the method, the dam has an upper portion and a lower portion, a width of the upper portion being less than a width of the gap, a width of the lower portion being greater than a width of the gap. In some embodiments of the method, the dam has tapered sides, the tapered sides of the dam forming an acute angle with a plane parallel to the first surface of the interposer. In some embodiments of the method, the underfill extends along first sides of the first and second integrated circuit devices, second sides of the first and second integrated circuit devices being free from the underfill. In some embodiments of the method, the underfill extends along first sides and second sides of the first and second integrated circuit devices, portions of the underfill along the first sides forming first fillets, portions of the underfill along the second sides forming second fillets, the first fillets and the second fillets having different sizes. In some embodiments of the method, the second fillets have a concave topmost surface.

In an embodiment, a package includes: an interposer having a first side; a first integrated circuit device attached to the first side of the interposer; a second integrated circuit device attached to the first side of the interposer; an underfill disposed beneath the first integrated circuit device and the second integrated circuit device; and an encapsulant disposed around the first integrated circuit device and the second integrated circuit device, a first portion of the encapsulant extending through the underfill, the first portion of the encapsulant physically disposed between the first integrated circuit device and the second integrated circuit device, the first portion of the encapsulant being planar with edges of the underfill and edges of the first and second integrated circuit devices.

In some embodiments of the package, the first portion of the encapsulant has an upper width and a lower width, the upper width being greater than the lower width. In some embodiments of the package, the first portion of the encapsulant has an upper width and a lower width, the upper width being less than the lower width. In some embodiments of the package, the first portion of the encapsulant has a uniform width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

an interposer having a first side and a second side opposite the first side;

a first integrated circuit device connected to the first side of the interposer, the first integrated circuit device having a first edge and a second edge;

a second integrated circuit device connected to the first side of the interposer, the second integrated circuit device having a third edge and a fourth edge, the first edge and the fourth edge each facing edge regions of the interposer, the second edge facing the third edge;

an underfill having a first portion and a second portion, the first portion disposed beneath the first integrated circuit device, the second portion disposed beneath the second integrated circuit device, the underfill having a first fillet along the first edge, the underfill having a second fillet along the fourth edge, the underfill having no fillets along the second edge and the third edge; and an encapsulant surrounding the first integrated circuit device and the second integrated circuit device, a third portion of the encapsulant disposed between the first portion and the second portion of the underfill, the third portion of the encapsulant contacting the first side of the interposer.

2. The device of claim 1, wherein the first portion and the second portion of the underfill are separated by a first distance, the first integrated circuit device and the second integrated circuit device are separated by a second distance, and the first distance is greater than the second distance.

3. The device of claim 1, wherein the first portion and the second portion of the underfill are separated by a first distance, the first integrated circuit device and the second integrated circuit device are separated by a second distance, and the first distance is less than the second distance.

4. The device of claim 1, wherein the first portion and the second portion of the underfill are separated by a first distance, and the first integrated circuit device and the second integrated circuit device are separated by the first distance.

5. The device of claim 1 further comprising:

a redistribution structure connected to the second side of the interposer.

6. The device of claim 5, wherein the interposer comprises:

an interconnect structure connected to the first integrated circuit device and the second integrated circuit device;

a substrate, the interconnect structure and the redistribution structure disposed on opposing surfaces of the substrate; and a through via extending through the substrate, the through via connected to the interconnect structure and the redistribution structure.

7. The device of claim 5 further comprising:

a package substrate; and conductive connectors connected to the package substrate and the redistribution structure.

8. The device of claim 1, wherein the first integrated circuit device and the second integrated circuit device are laid out asymmetrically in a plan view of the first side of the interposer.

9. The device of claim 1, wherein the interposer comprises:

a substrate;

an interconnect structure on the substrate, the interconnect structure connected to the first integrated circuit device and the second integrated circuit device; and a through via extending through the substrate, the through via connected to the interconnect structure.

10. A device comprising:

an interposer having a first side and a second side opposite the first side;

a plurality of integrated circuit devices connected to the first side of the interposer, the integrated circuit devices having an asymmetrically layout in a plan view of the first side of the interposer;

an underfill beneath each of the integrated circuit devices, wherein the underfill has first fillets, each of the first fillets extending along a first edge of one of the integrated circuit devices, the first edge disposed along an edge region of the interposer, the underfill having no fillets extending along other edges of the integrated circuit devices; and an encapsulant surrounding each of the integrated circuit devices, a first portion of the encapsulant extending through the underfill, the first portion of the encapsulant physically separating each of the integrated circuit devices from one another.

11. The device of claim 10 further comprising a redistribution structure connected to the second side of the interposer, wherein the interposer comprises:

an interconnect structure connected to each of the integrated circuit devices;

a substrate having a first surface and a second surface opposite the first surface, the interconnect structure disposed at the first surface of the substrate, the redistribution structure disposed at the second surface of the substrate; and through vias extending from the first surface of the substrate to the second surface of the substrate, the through vias connected to the redistribution structure and the interconnect structure.

12. The device of claim 11 further comprising:

a package substrate; and conductive connectors connected to the package substrate and the redistribution structure.

13. The device of claim 10, wherein the interposer comprises:

a substrate;

an interconnect structure on the substrate, the interconnect structure connected to each of the integrated circuit devices; and through vias extending through the substrate, the through vias connected to the interconnect structure.

14. A method comprising:

connecting a first integrated circuit device and a second integrated circuit device to an interconnect structure;

forming a dam between the first integrated circuit device and the second integrated circuit device by dispensing a filler material between the first integrated circuit device and the second integrated circuit device;

forming an underfill having a first portion and a second portion, the first portion disposed between the first integrated circuit device and the interconnect structure, the second portion disposed between the second integrated circuit device and the interconnect structure, the dam physically separating the first portion from the second portion;

removing the dam to form an opening exposing the interconnect structure by etching the filler material; and forming an encapsulant in the opening, around the first integrated circuit device, and around the second integrated circuit device.

15. The method of claim 14 further comprising:

curing the filler material by exposing the filler material to an ultraviolet light source.

16. The method of claim 15, wherein the filler material is a photoresist.

17. The method of claim 15, wherein the filler material is an acrylate.

18. The method of claim 14 further comprising:

forming a through via extending into a substrate;

forming the interconnect structure on a first surface of the substrate, the interconnect structure connected to the through via; and forming a redistribution structure on a second surface of the substrate, the redistribution structure connected to the through via.

19. The method of claim 18 further comprising:

connecting a package substrate to the redistribution structure.

20. The method of claim 14, wherein connecting the first integrated circuit device and the second integrated circuit device to the interconnect structure comprises asymmetrically placing the first integrated circuit device and the second integrated circuit device on the interconnect structure.

* * * * *